United States Patent
Lei et al.

(10) Patent No.: US 9,406,857 B2
(45) Date of Patent: Aug. 2, 2016

(54) CHIP SCALE LIGHT EMITTING DEVICE WITH METAL PILLARS IN A MOLDING COMPOUND FORMED AT WAFER LEVEL

(71) Applicant: KONINKLIJKE PHILIPS N.V., Eindhoven (NL)

(72) Inventors: Jipu Lei, Eindhoven (NL); Stefano Schiaffino, Eindhoven (NL); Alexander H. Nickel, Eindhoven (NL); Mooi Guan Ng, Eindhoven (NL); Grigoriy Basin, Eindhoven (NL); Salman Akram, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/405,532

(22) PCT Filed: Jun. 4, 2013

(86) PCT No.: PCT/IB2013/054584
§ 371 (c)(1),
(2) Date: Dec. 4, 2014

(87) PCT Pub. No.: WO2013/182980
PCT Pub. Date: Dec. 12, 2013

(65) Prior Publication Data
US 2015/0144971 A1    May 28, 2015

Related U.S. Application Data

(60) Provisional application No. 61/656,691, filed on Jun. 7, 2012.

(51) Int. Cl.
*H01L 33/00* (2010.01)
*H01L 33/62* (2010.01)
(Continued)

(52) U.S. Cl.
CPC ............... *H01L 33/62* (2013.01); *H01L 24/94* (2013.01); *H01L 27/156* (2013.01); *H01L 33/54* (2013.01);
(Continued)

(58) Field of Classification Search
CPC ........ H01L 33/62; H01L 33/54; H01L 27/156
USPC .............................................. 257/98, 99, 100
See application file for complete search history.

(56) References Cited

U.S. PATENT DOCUMENTS 6,828,596 B2    12/2004    Steigerwald et al.
2011/0104836 A1    5/2011    Rode et al.
(Continued)

FOREIGN PATENT DOCUMENTS

| DE | 102010025320 A1 | 12/2011 |
|---|---|---|
| EP | 2302672 A2 | 3/2011 |
| WO | 2013084155 A1 | 6/2013 |

OTHER PUBLICATIONS

EPO as ISA, PCT/IB2013/054584 filed Jun. 4, 2013, "International Search Report and Written Opinion", mailed Oct. 9, 2013, 10 pages.

*Primary Examiner* — Tan N Tran

(57) ABSTRACT

Thick metal pillars are formed upon light emitting dies while the dies are still on their supporting wafer. A molding compound is applied to fill the space between the pillars on each die, and contact pads are formed atop the pillars. The metal pillars provide electrical contact between the contact pads and the electrical contacts of each light emitting die. The metal pillars maybe formed upon an upper metal layer of each die, and this upper metal layer maybe patterned to provide connections to individual elements within the die.

12 Claims, 5 Drawing Sheets

(51) Int. Cl.
*H01L 23/00* (2006.01)
*H01L 27/15* (2006.01)
*H01L 33/54* (2010.01)

(52) U.S. Cl.
CPC ...... *H01L 2924/181* (2013.01); *H01L 2924/351* (2013.01); *H01L 2933/005* (2013.01); *H01L 2933/0033* (2013.01); *H01L 2933/0066* (2013.01)

(56) References Cited

U.S. PATENT DOCUMENTS

2011/0260184 A1* 10/2011 Furuyama ............... H01L 33/38
257/98
2012/0074441 A1 3/2012 Seo et al.

\* cited by examiner

CHIP SCALE LIGHT EMITTING DEVICE WITH METAL PILLARS IN A MOLDING COMPOUND FORMED AT WAFER LEVEL

CROSS-REFERENCE TO PRIOR APPLICATIONS

This application is the U.S. National Phase application under 35 U.S.C. §371 of International Application No. PCT/IB2013/054584, filed on Jun. 4, 2013, which claims the benefit of U.S. Patent Application No. 61/656691, filed on Jun. 7, 2012. These applications are hereby incorporated by reference herein.

FIELD OF THE INVENTION

This invention relates to the field of light emitting devices, and in particular to self-supporting chip-scale light emitting devices that do not require supporting submounts.

BACKGROUND OF THE INVENTION

Conventional thin-film light emitting devices are commonly formed on a wafer, diced/singulated into individual dies, and mounted on a submount structure. The submount provides the support required to support the individual dies, and the electrical circuitry that allows an external power source to be coupled to the light emitting dies. The submount structure is generally configured to host multiple light emitting devices, to provide for efficient additional processing, such as phosphor coating and encapsulation. The submount structure is subsequently sliced/diced to provide individual (singulated) light emitting devices that can be placed in lamps, attached to printed circuit boards, and so on.

The singulated light emitting devices may include multiple light emitting elements, to increase luminance, to produce a composite of multiple colors, and so on. The increasing size and complexity of such devices has led to the development of chip-scale fabrication techniques, wherein the semiconductor chip forming the light emitting device includes the circuitry required to interconnect the multiple elements, as well as providing external connections to these elements, thereby simplifying the features that may need to be included in the submount.

The use of a submount requires that the individual dies be singulated from the wafer, picked and placed accurately upon the submount, then affixed to the submount structure, typically via soldering. The operations that can be performed on the dies while still on the wafer may be limited due to the processes involved with affixing the individual dies on the submount structure.

Additionally, the singulation of the light emitting devices from the submount structure may be hampered by the structural support provided by the submount. The slicing apparatus must be able to cut through the submount, and a submount that is sufficiently thick and/or rigid to structurally support a group of light emitting devices through the additional processes is more difficult to slice than a non-structural support.

SUMMARY OF THE INVENTION

It would be advantageous to be able to avoid the need to mount light emitting devices on a submount structure. It would also be advantageous to be able to provide a wafer-scale process that produces self-supporting light emitting devices.

To better address one or more of these concerns, in an embodiment of this invention, thick metal pillars are formed upon light emitting dies while the dies are still on their supporting wafer. A molding compound is applied to fill the space between the pillars on each die, and contact pads are formed atop the pillars. The metal pillars provide electrical contact between the contact pads and the electrical contacts of each light emitting die. The metal pillars may be formed upon a metal layer of each die, and this metal layer may be patterned to provide connections to individual elements within the die.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1A:
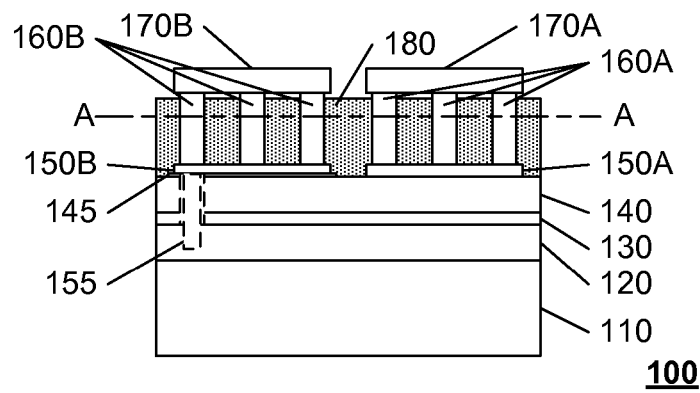
FIGS. 1A-1C illustrate an example light emitting device that is self-supporting via the use of metal pillars embedded in molding compound.
Figure 1B:
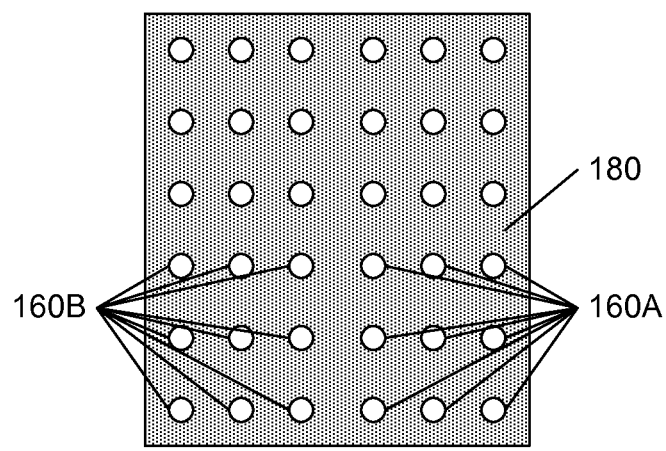
Figure 1C:
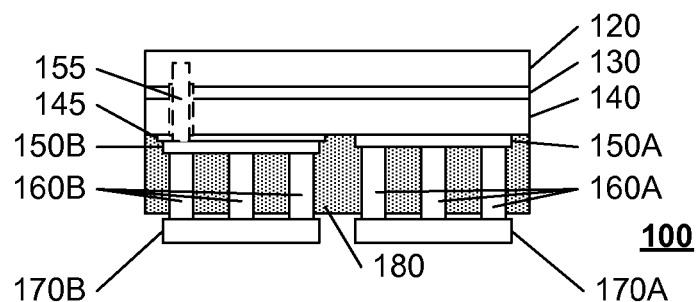

FIGS. 1A-1C illustrate an example light emitting device 100 that is self-supporting using metal pillars 160A, 160B embedded in molding compound 180.

The device 100 is formed on a substrate 110, typically a sapphire or other wafer. Substrate 110 may be rigid. Although only one device 100 is illustrated, the substrate 110 may typically support hundreds of devices 100. In a conventional process, a light emitting structure comprising an active region sandwiched between an N-type region (N-region) and P-type region (P-region) is grown of the substrate. In the example device 100, the N-region 120 is grown on the substrate 110, followed by the formation of the light emitting region 130, and the P-type region (P-region) 140. Each of these regions 120, 130, 140 may include a set of layers, which are omitted for ease of illustration and understanding. In the alternative, the P-region 140 may be grown on the substrate and the active layer 130 and N-region 120 may be formed on the P-region 140.

The semiconductor structure includes contacts 150A and 150B that provide electrical contact to the P-region 140 and N-region 120, respectively. The contact to the N-region 120 is provided by one or more vias 155 that extend through, and are insulated from, the active region 130 and P-region 140. An insulating layer 145 also isolates the N-contact 150B from the P-region 140.

In this example embodiment, a plurality of metal pillars 160A are formed upon the P-contact 150A, and a plurality of metal pillars 160B are formed upon the N-contact 150B. A molding compound 180 fills the space between the pillars 160A, 160B, collectively referred to as pillars 160 hereinafter, to inhibit lateral distortions of the pillars 160, which would weaken the structural support provided by these pillars 160. Any of a variety of metals or alloys may be used to form the pillars 160, provide the formed pillars are structurally supportive, and electrically as well as thermally conductive, such as pillars of copper, nickel, gold, palladium, nickel-copper alloy, or other alloys.

Although the pillars are illustrated as having a circular cross-section in each of the figures, one of skill in the art will recognize that other cross-sections are feasible, some of which may provide additional structural support. The cross-section, height, distribution, and density of the pillars 160 are fairly arbitrary, and conventional structural analysis systems may be used to assure that, in combination with the molding compound 180, sufficient structure is provided to allow these devices to be self-supporting for subsequent processes, and may be determined based on a variety of factors, including fabrication feasibility and other factors.

FIG. 1B illustrates a cross section view A-A of the metal pillars 160 embedded in the molding compound 180. As the term is used herein, the molding compound 180 may be any non-conductive compound that can be applied in a pliable form to fill the space between the pillars 160, and then hardened. For ease of reference, the term "filler material" 180 is used hereinafter, as a generic description of the material that fills the space between the metal pillars 160, which may or may not be considered a 'molding compound' as the term 'molding' may be conventionally interpreted. For example, in some embodiments, the filler material 180 may be formed before the metal pillars 160 are formed, with vias that are subsequently filled with metal to form the metal pillars 160. In some embodiments, the pillars may be formed by applying a series of metal layers, and the filler material may also be formed as a series of layers during the formation of the pillars.

Contact pads 170A, 170B, collectively referred to as pads 170, are formed or affixed upon the pillars 160A, 160B, respectively. These pads 170A, 170B provide external connection to the P-region 140 and N-region 120, via the metal pillars 160A, 160B, respectively.

After forming the pads 170, the devices 100 may be removed from the substrate 110, the metal pillars 160 embedded in the compound 180 providing a mechanical structure that is sufficient to prevent fractures or other damage to the semiconductor regions 120, 130, 140. Depending upon the particular singulation process, the regions ("streets") between the individual devices 100 may be sliced while on the substrate 110, or after the set of devices 100 on the substrate 110 are removed en masse from the substrate 110.

As illustrated in FIG. 1C, after singulation, the device 100 is typically 'flipped' to allow the pads 170 to be subsequently soldered to a printed circuit board or placed in a lamp fixture, with the light that is emitted from the active region 130 exiting through the N-region 120 and/or the edge of device 100.

As illustrated, the pillars 160 embedded in the filler material 180 provide the structural support and electrical connectivity that is typically provided by a separate submount structure, such as disclosed in U.S. Pat. No. 6,828,596, "CONTACTING SCHEME FOR LARGE AND SMALL AREA SEMICONDUCTOR LIGHT EMITTING FLIp-CHIP DEVICES", issued to Daniel A. Steigerwald, Jerome C. Bhat, and Michael J. Ludowise, and incorporated by reference herein. However, by forming this support structure 160, 180 while the device 100 is among a plurality of devices 100 on the substrate 110, the requirement to pick, place, and attach each individual device 100 to a submount is eliminated.

Additionally, because the streets between devices 100 will not include the metal pillars 160, the difficulty of slicing along these streets to singulate the devices 100 will be dependent upon the compound 180, or other material, that may be situated in these streets. Because the compound 180 is primarily used to merely fill the space between the structural pillars 160, and not, per se, to provide structural support, it may comprise a material that is easy to slice. Optionally, another material that is more easily removable or sliceable may be built up along these streets before the compound 180 is applied. A conventional easy-to-remove photoresist material, for example, may be built up on these streets, then removed to facilitate slicing through the relatively thin structure of regions 120, 130, 140.

Other techniques may be used to provide a self-supporting light emitting device, including the formation of a thick metal layer upon each of the contacts 150A, 150B, as disclosed in copending U.S. patent application 61/568,297, "FORMING THICK METAL LAYERS ON A SEMICONDUCTOR LIGHT EMITTING DEVICE", filed 8 Dec. 2011 for Alexander Nickel, Jim Lei, Anneli Munkholm, Grigoriy Basin, Sal Akram, and Stefano Schiaffino, and incorporated by reference herein. However, the use of a plurality of at least four pillars 160 that support pads 170, in lieu of two solid thick metal pads, may substantially reduce potential distortions and damage caused by differences among the coefficients of thermal expansion (CTEs) between the solid metal pads and the P-region 140. The use of a filler material 180 between the pillars 160 allows for the selection of a compound 180 that has similar thermal characteristics as the P-region 140, while also having greater pliability to withstand the thermal stress caused by different CTEs and other factors.

The example embodiment of FIGS. 1A-1C assumes a fairly simple construct of the device 100, for ease of illustration and understanding. One of skill in the art, however, will recognize that in some embodiments, the possibility of using such a simple construct may not exist, or may be too costly to implement. In large scale light emitting devices 100, for example, it may not be feasible to use a single via 155 to couple the N-region 120 to a contact 150B, or even assume that the vias 155 will be located directly beneath the N-pads 170B, particularly in view of the increased complexity and size of newer light emitting devices.

As the capability of light emitting devices increases, the complexity of the structure used to provide such capability also increases. For example, a light emitting device may include a plurality of individual light emitting elements, or a light emitting element that occupies a large area. In such devices, a uniform current distribution through each light emitting region 130 is preferred, and the non-uniform structure of the device 100 of FIGS. 1A-1C, with contacts to the N-region 120 being on left, and contacts to the P-region 140 being on the right, may not be suitable.

Figure 2A:
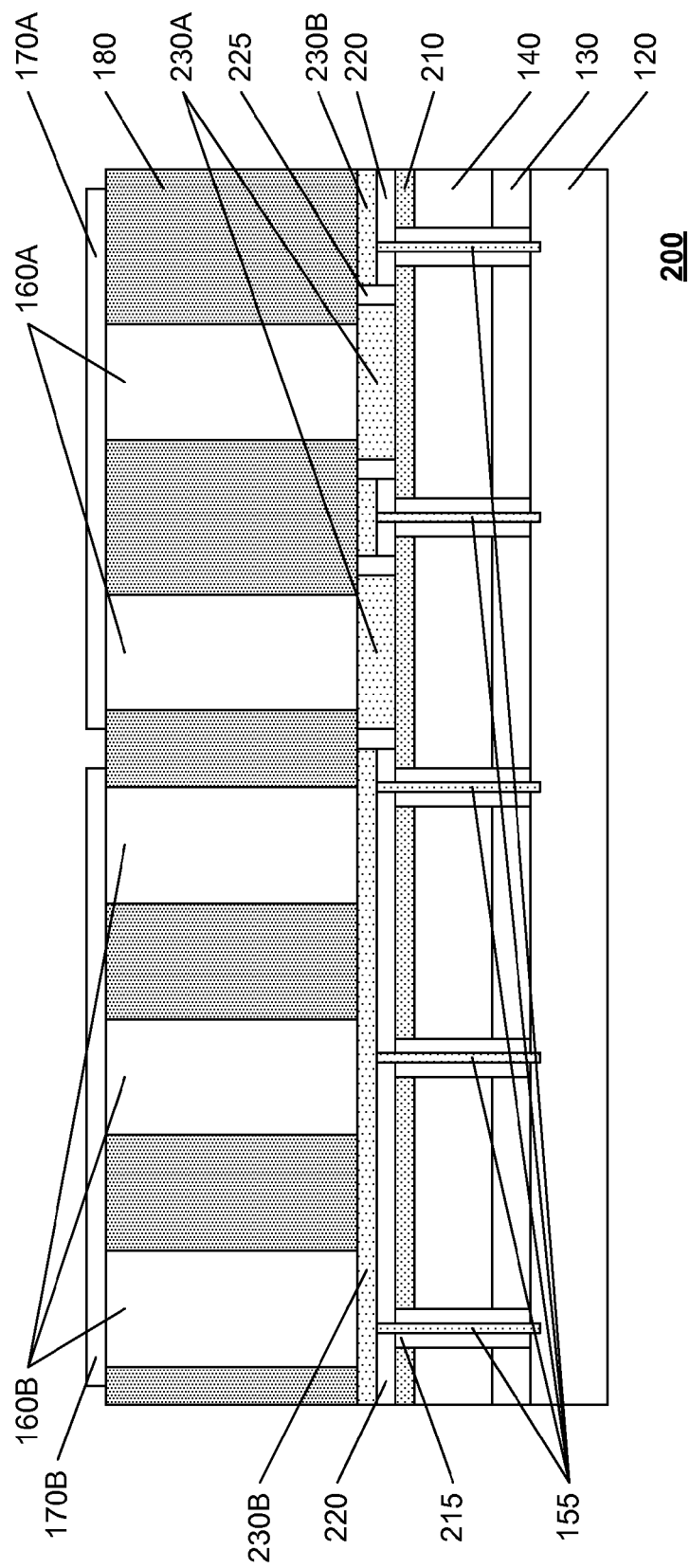
FIGS. 2A-2C illustrate an example set of metal layers that facilitate contact between the contact pads of the self-supporting device and the light emitting die via the metal pillars that provide the self-support.
Figure 2B:
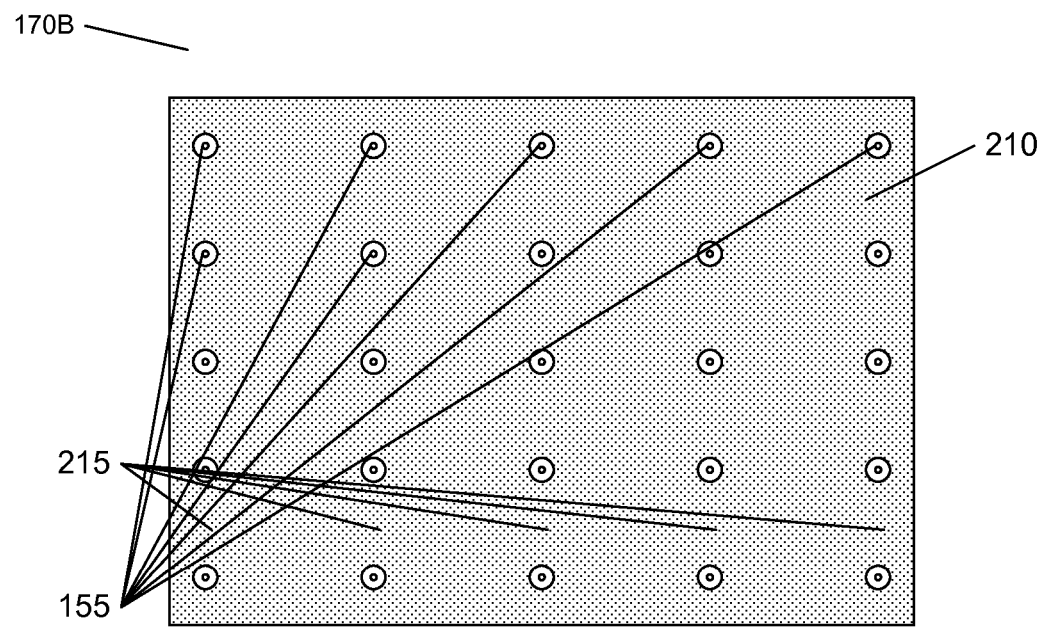
Figure 2C:
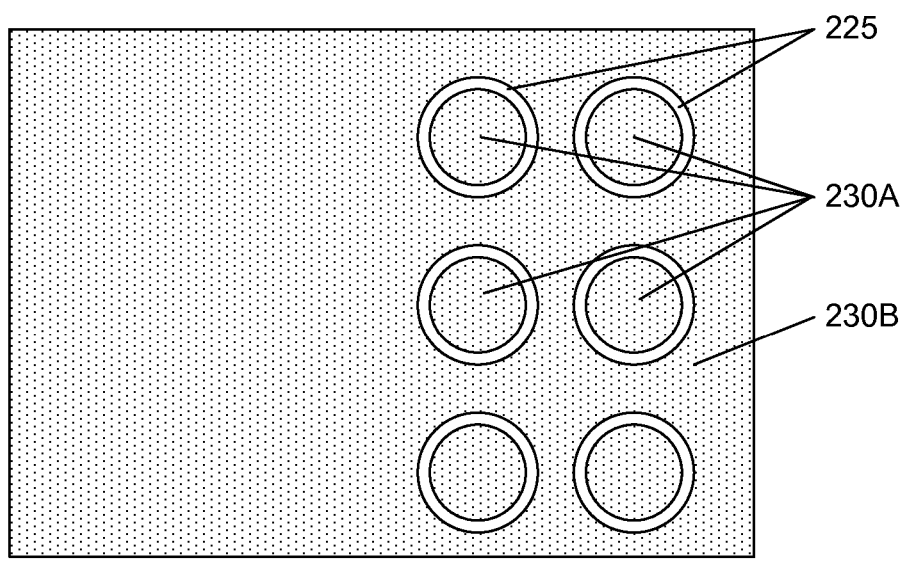
Figure 3A:
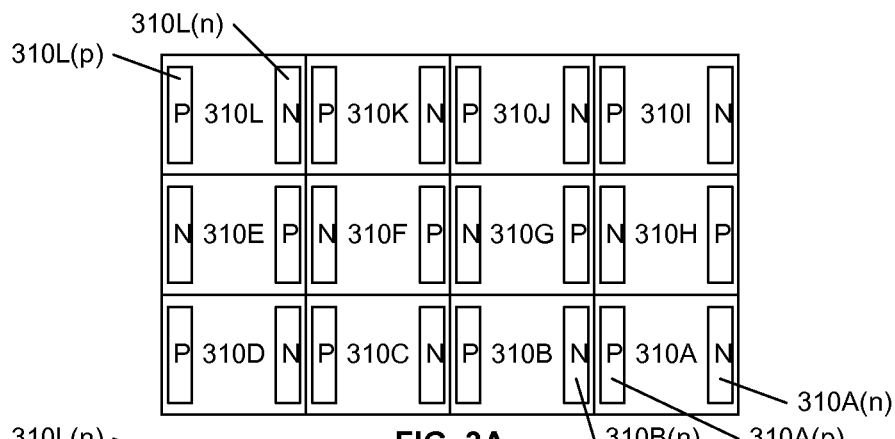
FIGS. 3A-3D illustrate an example patterning of a set of metal layers that facilitates connections between elements of the light emitting die.
Figure 3B:
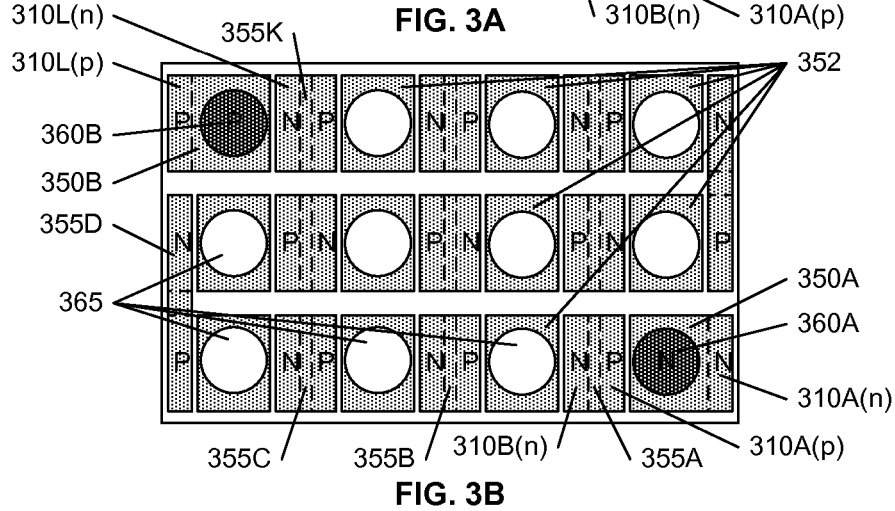
Figure 3C:
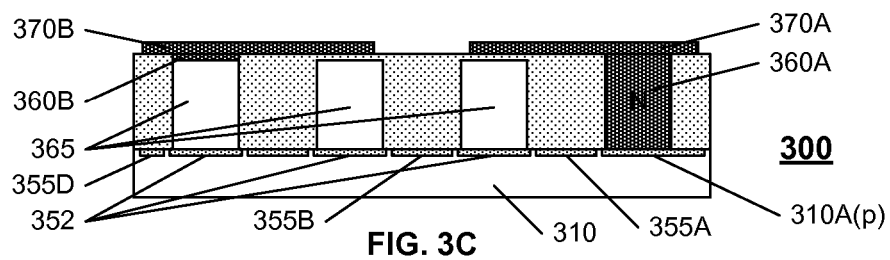
Figure 3D:
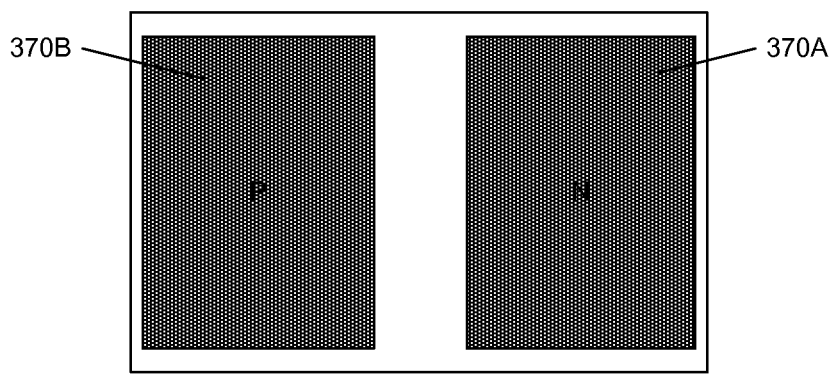

FIGS. 2A-2C illustrate an example light emitting device 200 with a more complex structure than that of FIGS. 1A-1C, including an example set of metal layers that facilitate contact between the contact pads of the self-supporting device and the light emitting die via the metal pillars that provide the self-support.

In the example light emitting device 200 of FIG. 2A, the vias 155 that provide contact to the N-region 120 are distributed across the entire area of the N-region 120, thereby assuring that current flow through the N-region 120 is substantially uniform.

In like manner, a metal contact layer 210 extends across the entire P-region 140, to assure that the current flow through the P-region 120 is also substantially uniform. FIGS. 2A and 2B (at smaller scale) illustrates the P-contact layer 210, with insulating regions 215 that allow the N-region vias 155 to extend through the P-contact layer 210. As illustrated in FIG. 2A, this insulation 215 also extends through the P-region 140 and the active region 130.

An insulating layer 220 extends over the P-contact layer 210, to allow metal layer 230B to establish contact with the distributed N-region vias 155. In the example of FIG. 2C, to minimize manufacturing complexity, this metal layer 230B extends across the entire area of the device 200, except where contact to the P-contact layer 210 is desired. In this example, insulating regions 225 are established using conventional techniques such as photolithographic etching, then a metal layer is formed, with the insulating regions 225 segregating the metal layer into N-metal segment 230B and P-metal segments 230A.

As illustrated in FIG. 2A, the P-pillars 160A are formed upon the P-metal segments 230A, and the N-pillars 160B are formed upon the N-metal segment 230B. After forming these pillars 160, the space between the pillars 160 is filled with a filler material 180. P-pad 170A and N-pad 170B are then formed upon P-pillars 160A and N-pillars 160B, respectively.

One of skill in the art will recognize that any of a variety of configurations of pillars, contact layers, vias, and the like may be used, including configurations in which some or all of the pillars 160 only provide mechanical support, without providing electrical connectivity. For example, a significant space may exist between the pads 170, yet pillars 160 may be formed beneath this space that are not connected to either of the pads 170. In like manner, some of the pillars 160 may be formed over any area that is not connected to either the P-metal segments 230A or N-metal segments 230B.

FIGS. 3A-3D illustrate an example light emitting device 300 that includes a plurality of 'inactive' metal pillars that are not used to conduct current. For ease of reference and understanding, the combination of N-region 120, active region 130, and P-region 140 is referred to hereinafter as light emitting structure 310.

The example light emitting structure 310 of FIGS. 3A-3D is configured to contain a plurality of individual light emitting elements 310A-310L, each having a P-contact and an N-contact, and a non-conductive region between these contacts. For convenience, the P and N contacts of each element 310A-310L are identified by the element's identifier followed by (p) or (n), as appropriate. For example, the P and N contacts of element 310A are identified herein as 310A(p) and 310A(n) respectively.

Depending upon the intended use of the device 300, the individual elements 310A-310L may be arranged in any of a variety of configurations. If the elements 310A-310L are to be arranged in parallel, a P-metal layer and N-metal layer may be formed to connect all of the P-contacts together and all of the N-contacts together, and pillars created to couple these metal layers to external pads. In an embodiment where each of the elements 310A-310L are individually controllable, pillars may be formed for each contact that is to be externally available for control, and individual pads formed on each pillar or set of pillars corresponding to each controllable contact of the elements 310A-310L.

In the example of FIGS. 3A-3D, the elements 310A-310L are to be arranged in series. Accordingly, a metal layer is formed with segments 355A-355K that couple the N and P contacts of adjacent elements 310 together. For example, metal segment 355A couples the P-contact 310A(p) of element 310A to the N-contact 310B(n) of element 310B; segment 355D couples 310D(p) to 310E(n); and segment 355K couples 310K(p) to 310L(n).

At the beginning and end of this series connection, segment 350A is coupled to 310A(n), and 350B is coupled to 310L(p). Application of a suitable voltage across segments 350A and 350B will cause current to flow through the series of elements 310A-310L, with a resulting emission of light from each of the light emitting elements 310A-310L.

To minimize manufacturing complexity, when the active segments 355A-355K that are coupled to the N and P contacts of adjacent elements 310A-310K are formed, inactive metal segments 352 that are not coupled to the elements 310A-310L may also be formed in the non-conducting regions between the N and P contacts of each element 310A-310L, or any other non-conducting region, to serve as a seed layer upon which inactive pillars 365 may be formed.

In this example of a series connection through the elements 310A-310K, only the pillars 360A and 360B that are formed upon active segments 350A and 350B are active pillars, being coupled to the light emitting structures through 310A(n) and 310K(p) respectively. Each of the other pillars 352 are inactive pillars, as they are not connected to any of the light emitting elements 310A-310L.

The active pillars 360A, 360B are coupled to the external pads 370A and 370B, which may be sized and positioned to ease subsequent mounting on printed circuit boards or other lamp elements. For example, by creating large pads that are spaced relatively far apart, the precision required to place and affix the device 300 to a printed circuit board or other fixture may be substantially reduced.

Although the example of FIGS. 3A-3D illustrate a single pillar at each element 310A-310L, one of skill in the art will recognize that there may also be a many-to-one or one-to-many relationship between the number of pillars and the number of light emitting elements. For example, if each of the elements 310A-310L are to be independently controllable, at least two active pillars would be formed on each element 310A-310L, to provide coupling to each of the N and P contacts of each of these elements.

As illustrated in this example device 300 of FIGS. 3A-3D, the interconnection circuitry 355A-355K that connects the devices in series, which is normally provided by the convention submount, may be included in the formation of the support structure at the wafer scale level, thereby avoiding the need to create such submounts to provide this interconnection circuitry.

Figure 4:
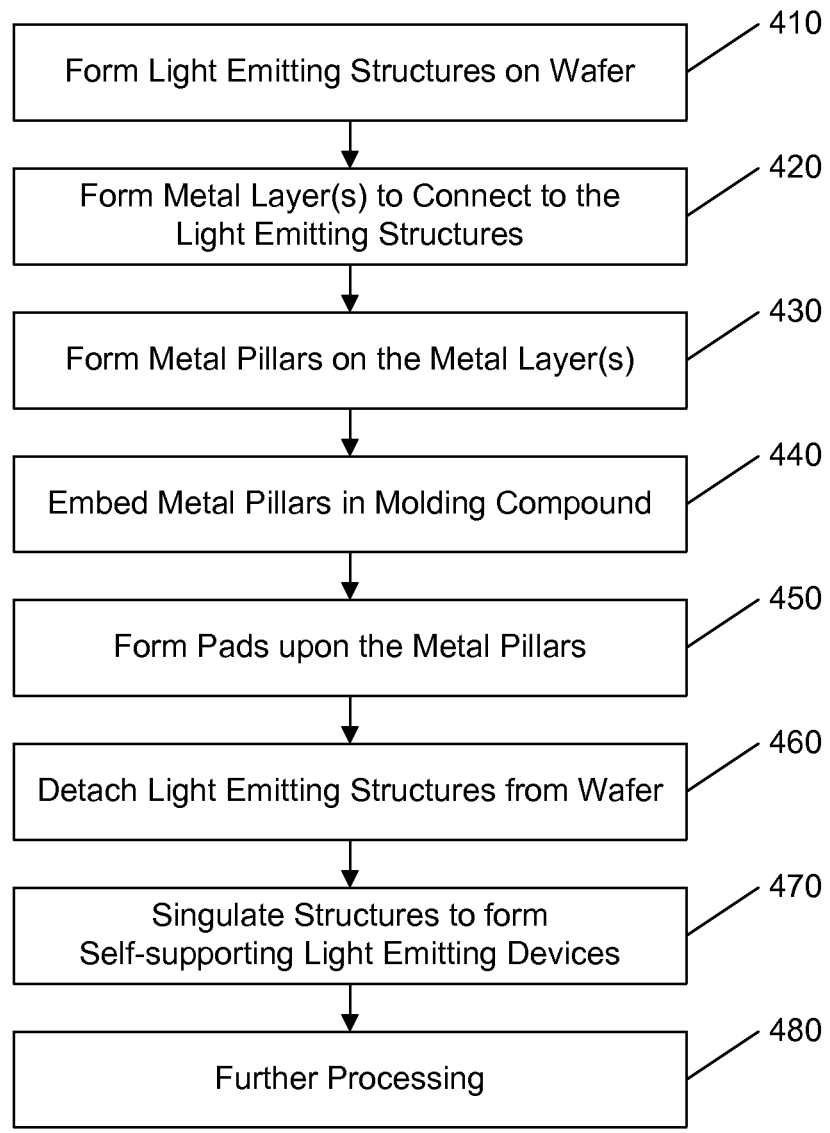
FIG. 4 illustrates an example flow diagram for the creation of a self-supporting light emitting device that includes metal pillars embedded in molding compound to provide the self-support.

FIG. 4 illustrates an example flow diagram for the creation of a self-supporting light emitting device that includes metal pillars embedded in filler material to provide the self-support.

At 410, a plurality of light emitting structures are formed on a wafer. These structures may be formed using conventional techniques, and may include the formation of multiple light emitting elements within each light emitting structure. The light emitting structures may be separated from each other by lanes, or streets, that facilitate slicing/dicing the structure into singulated light emitting devices. Each of the light emitting structures includes an active region sandwiched between an N-region and a P-region, and includes accessible contacts to the N-region and the P-region for providing current to the structure.

At 420, one or more metal layers are formed to facilitate coupling metal pillars to the contacts of each light emitting structure. The metal layer may include circuitry to interconnect elements within the light emitting structure, and may include inactive segments that are not couple to elements of the light emitting structure.

At 430, a plurality of metal pillars are formed. The aforementioned one or more metal layers may form a seed layer for forming these metal pillars, although inactive pillars may be formed over non-metallic surfaces. One or more pillars may be connected to the contact to the P-region and one or more pillars may be connected to the contact to the N-region. If the light emitting structure includes multiple independently controllable light emitting elements, one or more pillars may be connected to one or more contacts of the controllable light emitting elements.

At 440, a filler material is applied to fill the space between the pillars. This filler material may be any material with a viscosity that allows it to flow between the formed pillars without distorting the pillars, and a firmness in hardened form that prevents subsequent distortion of the pillars. The compound may be selected to have a coefficient of thermal expansion (CTE) that is close to the CTE of the P-region, to minimize thermal stress during subsequent processing or operation. The compound may be formed to cover the pillars, then processed to expose a sufficient amount of the pillars to allow the pillars to be coupled to the pads, using microblasting or other similar planing techniques.

As noted above, the particular sequence of forming the metal pillars and filling the space between the metal pillars may occur in any order. That is, in some embodiment, the filler material may be formed with openings in which the metal pillars are formed. The filler material is formed to occupy the space between the pillars, regardless of when the pillars are actually formed.

At 450, pads are attached to the pillars that are coupled to the contacts of the light emitting structures. Two pads are commonly provided, although additional pads may be provided if the light emitting structure includes multiple contacts. The sizing and placement of the pads on the light emitting structure may be selected to facilitate ease of mounting the singulated light emitting device to a printed circuit board or other lamp fixture.

At 460, the light emitting structures are detached from the wafer using convention wafer detachment techniques. Because the light emitting structures now include the metal pillars embedded in a filler material, the risk of damage to the light emitting regions of the light emitting structure during this process and subsequent processes is minimal.

At 470, the light emitting structures are sliced along the streets that separate the structures, thereby forming individual (singulated) self-supported light emitting devices with pads for connection to an external power source. As noted above, the light emitting structures may be sliced while still on the wafer, then singulated when they are detached from the wafer.

At 480, the light emitting devices are further processed as required. This further processing may include an application of one or more phosphor layers, an encapsulation of the device with a transparent material, such as a glass or epoxy dome, and so on.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:

1. A method comprising:
    forming a light emitting structure on a substrate, the light emitting structure including an active region sandwiched between an N-region and a P-region, and contacts to the N-region and the P-region,
    forming a first metal segment that is coupled to the contact to the N-region and a second metal segment that is coupled to the contact to the P-region,
    forming a plurality of metal pillars for the light emitting structure, the metal pillars including at least one first metal pillar coupled to the first metal segment, at least one second metal pillar coupled to the second metal segment, and at least one third pillar that is inactive and not electrically connected to any light emitting structure, so that no current flows through the third pillar during operation of the light emitting structure,
    forming a filler material that occupies spaces between the metal pillars,
    forming a plurality of metal pads include a first metal pad that is coupled to the first metal pillar and a second metal pad that is coupled to the second metal pillar, the first and second metal pads being situated to provide external connection to the N-region and P-region via the first and second metal pillars.

2. The method of claim 1, wherein the light emitting structure is one of a plurality of light emitting structures that are formed on the substrate.

3. The method of claim 2, wherein the light emitting structures are separated from each other by streets, and the method includes forming individual light emitting devices by slicing through the streets.

4. The method of claim 3, including detaching the light emitting structures from the substrate.

5. The method of claim 2, including detaching the light emitting structures from the substrate.

6. The method of claim 1, wherein the filler material has a coefficient of thermal expansion that is not significantly different from a coefficient of thermal expansion of the P-region.

7. The method of claim 1, wherein the at least one first metal pillars include a plurality of the first pillars that provide coupling between the first pad and the first metal segment and the at least one second metal pillars include a plurality of the second pillars that provide coupling between the second pad and the second metal segment.

8. The method of claim 1, wherein the light emitting structure includes a plurality of light emitting elements, and the method includes forming at least one third metal segment that interconnects at least two of the light emitting elements.

9. A light emitting device comprising:
    a light emitting structure comprising an N-region, a P-region, an active region that is sandwiched between the N-region and the P-region, a first contact to the N-region and a second contact to the P-region, a plurality of metal pillars for the light emitting structure, the metal pillars including at least a first pillar coupled to the first contact and at least a second pillar coupled to the second contact, a filler material that occupies space between the pillars, and a first pad and second pad that are coupled to the first pillar and second pillar, respectively, and provide external coupling to the N-region and P-region via the first and second pillars, wherein the plurality of pillars further includes one or more inactive pillars that are not connected to any light emitting structure, so that during operation of the light emitting structure, no current flows through the inactive pillars.

10. The light emitting device of claim 9, wherein the filler material has a coefficient of thermal expansion that is not significantly different from a coefficient of thermal expansion of the P-region.

11. The device of claim 9, wherein multiple pillars provide coupling between the first pad and the first contact and multiple other pillars provide coupling between the second pad and the second contact.

12. The device of claim 9, wherein the light emitting structure includes a plurality of light emitting elements, and the device includes at least one metal segment that interconnects at least two of the light emitting elements.

* * * * *